United States Patent
Watanabe et al.

(10) Patent No.: US 7,432,040 B2
(45) Date of Patent: Oct. 7, 2008

(54) MANUFACTURING METHOD OF THICK FILM MEMBER PATTERN

(75) Inventors: Osamu Watanabe, Yokohama (JP); Masaaki Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 500 days.

(21) Appl. No.: 11/166,102

(22) Filed: Jun. 27, 2005

(65) Prior Publication Data

US 2006/0003264 A1 Jan. 5, 2006

(30) Foreign Application Priority Data

Jun. 30, 2004 (JP) .............................. 2004-193199
Jun. 14, 2005 (JP) .............................. 2005-173344

(51) Int. Cl.
*G03F 7/26* (2006.01)

(52) U.S. Cl. ........................ 430/311; 430/319; 430/330

(58) Field of Classification Search ................. 430/311, 430/313, 319, 330
See application file for complete search history.

(56) References Cited

U.S. PATENT DOCUMENTS 5,052,033 A 9/1991 Ikeda et al. ................... 378/35
6,866,989 B2 3/2005 Watanabe et al. ........... 430/394
2003/0049572 A1 3/2003 Watanabe et al. ........... 430/394
2004/0185379 A1* 9/2004 Iha .............................. 430/312
2006/0003480 A1 1/2006 Suzuki et al. ................. 438/34

FOREIGN PATENT DOCUMENTS

JP         408286200      * 11/1996
JP         11-149862        6/1999
JP         2003-195513      7/2003

* cited by examiner

*Primary Examiner*—Kathleen Duda
(74) *Attorney, Agent, or Firm*—Fitzpatrick, Cella, Harper & Scinto

(57) ABSTRACT

A method of manufacturing an image forming apparatus having a plurality of electron-emitting members, with row direction wires and column direction wires, in a matrix, and a dielectric layer between the row and column wires. A resist precursor layer is formed by imparting and drying a first photosensitive paste. A second precursor layer is formed by imparting a second photosensitive paste onto the first precursor layer, and by drying the second paste. A precursor pattern is formed by exposing a layered product of the first layer and the second layer through a mask. The exposed layered product is developed, and the dielectric layer is formed by baking the precursor pattern. A shrinkage ratio of the second layer after the baking to the second layer before the baking is larger than a shrinkage ratio of the first layer after the baking to the first layer before the baking.

3 Claims, 3 Drawing Sheets

MANUFACTURING METHOD OF THICK FILM MEMBER PATTERN

This application claims priority from Japanese Patent Application No. 2004-193199, filed Jun. 30, 2004, and No. 2005-173344, filed Jun. 14, 2006, which are hereby incorporated by reference herein.

BACKGROUND OF THE INVENTION

1. Field of the Invention

The present invention relates to a method of manufacturing a thick film member pattern, such as an insulating material pattern arranged on a substrate on which electron-emitting members are arranged, and an interlay insulation layer pattern arranged between a plurality of wires as in a surface conduction electron-emitting device, a partition wall pattern and a dielectric pattern formed on a substrate as in a plasma display, an insulating material pattern or a conductive material pattern formed on a substrate as in a circuit substrate, or an electroconductive pattern.

2. Description of the Related Art

As a manufacturing method of a thick film member pattern formed as a thick film for obtaining a predetermined electrical conductivity and an insulation property in an electroconductive pattern and an insulating pattern, which constitute each of various displays, for example, a method using a photosensitive paste, which is disclosed in Japanese Patent Application Laid-Open No. 2003-195513 (United States Patent Application Publication No. 2003-049572) can be cited. The method performs exposure a plurality of times to a photosensitive paste layer imparted on a substrate, and develops and bakes the photosensitive paste layer. Alternatively, the method repeats a process of imparting a photosensitive paste on a substrate to expose and develop it. Thereby, the method obtains a high-definition member pattern, which has no baking dregs at the pattern edges, and has less pattern shrinkage by baking.

However, because the method of Japanese Patent Application Laid-Open No. 2003-195513 (United States Patent Application Publication No. 2003-049572) performs the exposure a plurality of times, the alignment of the mask and the substrate at the time of each exposure is troublesome. Moreover, a method of manufacturing a stabilized thick film member pattern, which promotes the further improvement of solid shapes (the forward tapered shape in an edge portion and the flatness performance in a surface position) without increasing the number of processes, is desired.

SUMMARY OF THE INVENTION

It is an object of the present invention to provide a method of manufacturing a thick film member pattern in a higher pattern accuracy with a small number of processes, and further to provide a method of manufacturing a stabilized thick film member pattern, which excels in solid shapes (the forward tapered shape in an edge portion and the flatness performance in a surface portion).

A manufacturing method of a thick film member pattern arranged on a substrate includes the steps of:

forming a first precursor layer by imparting a first photosensitive paste onto a substrate, and by drying the first photosensitive layer;

forming a second precursor layer by imparting a second photosensitive paste onto the first precursor layer, and by drying the second photosensitive paste;

forming a precursor pattern by exposing a layered product of the first precursor layer and the second precursor layer through a mask of a predetermined pattern, and by developing the exposed layered product; and forming the thick film member pattern by baking the precursor pattern, wherein a shrinkage ratio of the first precursor layer at the baking and a shrinkage ratio of the second precursor layer at the baking are different from each other.

A manufacturing method of a thick film member pattern arranged on a substrate includes the steps of:

forming a first precursor layer by imparting a first photosensitive paste onto a substrate, and by drying the first photosensitive paste;

forming a second precursor layer by imparting a second photosensitive paste onto the first precursor layer, and by drying the second photosensitive paste;

forming a precursor pattern by exposing a layered product of the first precursor layer and the second precursor layer through a mask of a predetermined pattern, and by developing the exposed layered product; and forming the thick film member pattern by baking the precursor pattern, wherein a shrinkage ratio of the first precursor layer at the baking and a shrinkage ratio of the second precursor layer at the baking are different from each other.

BRIEF DESCRIPTION OF THE DRAWINGS

Figure 2:
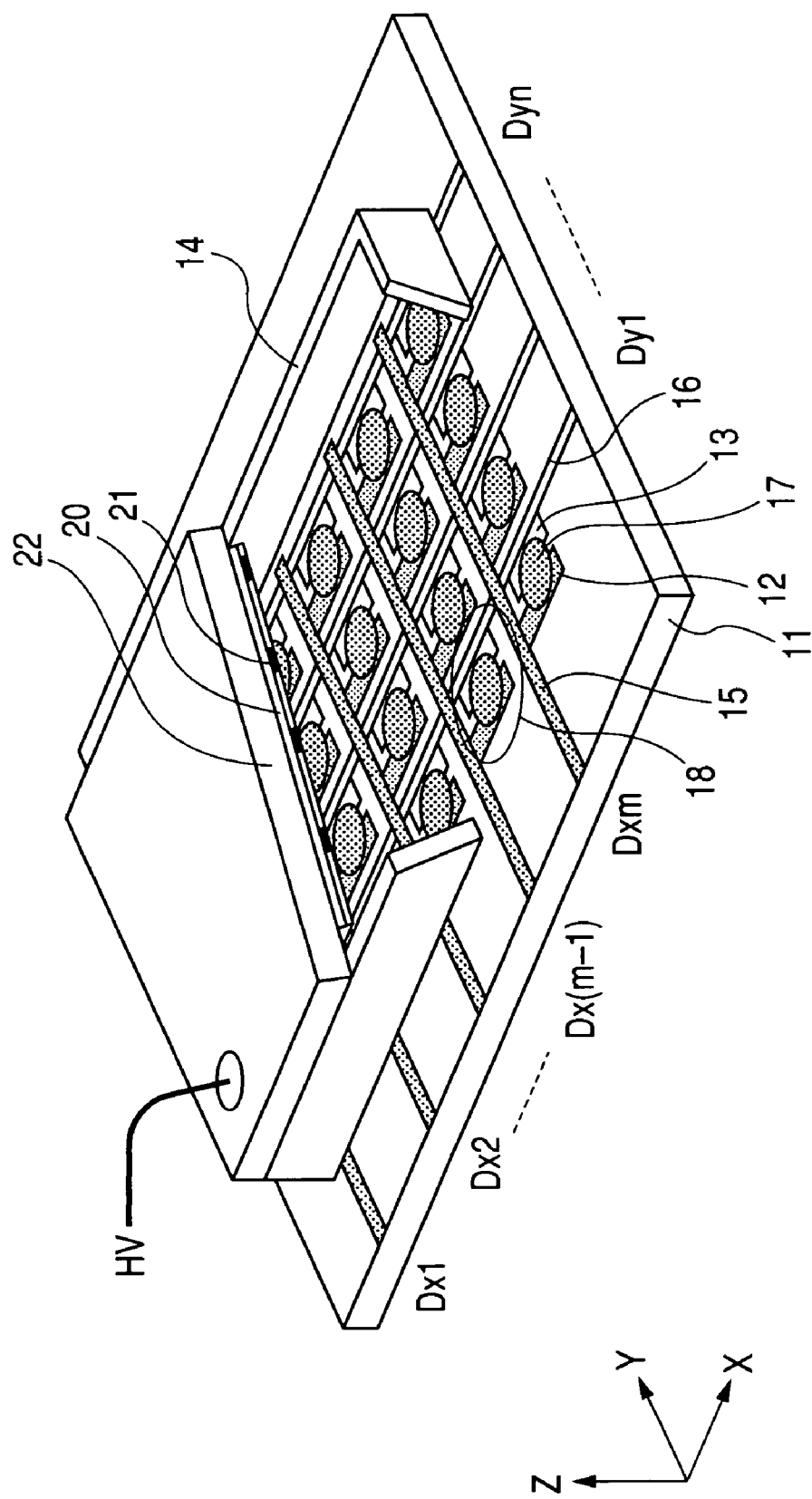

FIGS. 1A, 1B, 1C, 1D and 1E are typical sectional views showing processes of a first embodiment of a manufacturing method of the present invention;

FIG. 2 is a schematic perspective view of an image-forming apparatus of the present invention; and FIGS. 3A, 3B, 3C, 3D, 3E and 3F are process charts showing a method of manufacturing the image-forming apparatus of the present invention.

DETAILED DESCRIPTION OF THE PREFERRED EMBODIMENTS

An embodiment of the present invention is described hereinafter.

A thick film member pattern manufactured by the present invention is applied to any of conductive materials and dielectrics, such as an insulating material pattern and a conductive material pattern arranged on a substrate, on which electron-emitting members are arranged, and an interlayer insulation layer pattern arranged between a plurality of wires as in surface conduction electron-emitting device, a partition wall pattern and a dielectric pattern formed on a substrate, as in a plasma display, and an insulating material pattern and a conductive material pattern formed on a substrate, as in a circuit substrate. In particular, because the insulating material arranged on the substrate on which the electron-emitting members are arranged and the interlayer insulation layer pattern arranged between the plurality of wires severally have a large film thickness within a range of from about 10 to about 30 μm, distortion of their shapes is easily produced. Consequently, the insulating material pattern and the interlayer insulation layer pattern are preferable members to which the present invention is applied. Incidentally, the present invention described below is applicable not only to the insulating material pattern, but also to the conductive material pattern, such as a wire.

FIGS. 1A, 1B, 1C, 1D and 1E are typical sectional views showing the processes of an embodiment of a manufacturing method of the present invention. Each process of the present invention is described below in detail with reference to FIGS. 1A, 1B, 1C, 1D and 1E.

(Process 1)

Figure 1A:
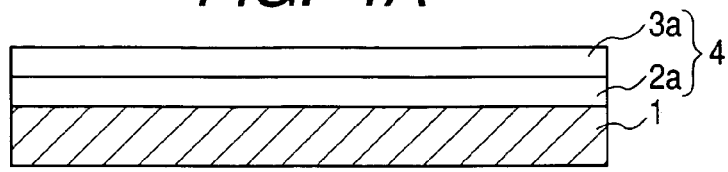
FIGS. 1A, 1B, 1C, 1D and 1E are typical methods of manufacturing a stabilized thick film member pattern, which excels in solid shapes (the forward tapered shape in an edge portion and the flatness performance in a surface portion).

Onto a substrate 1, a first photosensitive paste is imparted, and it is dried to form a first precursor layer 2a. Subsequently, onto the first precursor layer 2a, a second photosensitive paste is imparted, and it is dried to form a second precursor layer 3a. Thus, a layered product 4 of the first precursor layer 2a and the second precursor layer 3a is formed, as shown in FIG. 1A.

In the present invention, the shrinkage ratios of the first precursor layer 2a and the second precursor layer 3a by baking differ from each other. The photosensitive paste used for the manufacturing method of the present invention is composed by, for example, adding glass frit containing introduced lead oxide or bismuth oxide to a photosensitive organic component, a solvent, and the like, in the case of manufacturing a dielectric pattern. Moreover, in the case of manufacturing a conductive material pattern, the photosensitive paste is composed by, for example, adding Ag particles and glass frit to a photosensitive organic component, a solvent, and the like. In this case, the above-mentioned shrinkage ratios can be adjusted by adjusting the quantities of the photosensitive organic component and the solvent in the first precursor layer and in the second precursor layer.

As the method of imparting each photosensitive paste, the ordinal screen printing method, the bar coat method, and the like, can be used to form the photosensitive paste to be a thick film thickness within a range of from 5 to 40 μm.

(Process 2)

A one-shot exposure is given to the layered product 4 formed at Process 1 through a mask 5 having a predetermined pattern. Each of the precursor layers 2a and 3a is photopolymerized to be a precursor pattern 6 composed of cured layers 2b and 3b, as shown, respectively, in FIG. 1B. The exposure is made with an ordinary proximity exposure apparatus. The mask 5 is aligned at a predetermined position, and parallel light 7 passes a minute gap through aperture portions 8 of the mask 5 corresponding to a desired thick film member pattern 9 to be radiated to the layered product 4. At this time, because each of the precursor layers 2a and 2b is exposed all at one time, there are no positional discrepancies between the cured layers 2b and 3b, which are the respective latent images of the precursor layers 2a and 2b, and finally, a uniform sectional shape is obtained.

Figure 1B:
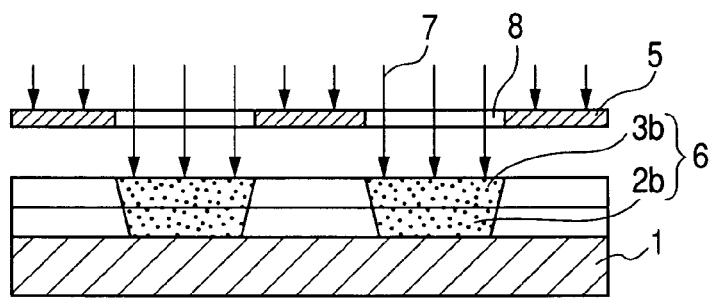

However, the light having a wavelength of about 365 nm, which contributes to photosensitivity, is ordinarily attenuated owing to the absorption or scattering in the material, as the light advances toward lower positions, and then, latent image widths become smaller. Consequently, as shown in FIG. 1B, the latent image widths become almost continuously smaller toward the cured layers 3b from the cured layers 2b.

(Process 3)

Figure 1C:
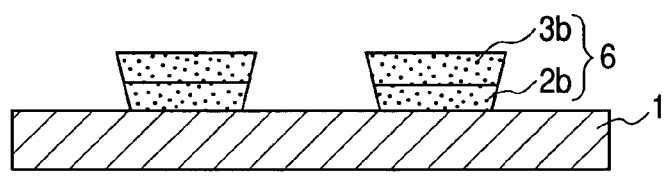

FIG. 1C shows a state after one-shot development. Usually, the development is performed as follows. That is, after performing development in a weak alkaline solution capable of dissolving unexposed portions, the development is stopped by the rinse of pure water, and performs hydro-extracting and drying with an air knife. In the present invention, the one-shot development is performed using a developing solution capable of dissolving the unexposed portions of both of the first precursor layers 2a and the second precursor layers 3a simultaneously.

(Process 4)

Figure 1D:
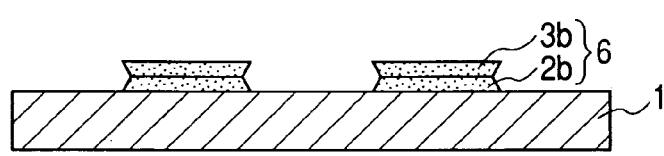

The precursor pattern 6 is baked. Here, each of the cured layers 2b and 3b of the precursor pattern 6 flows while being softened, combined and melted. Then, the cured layers 2b and 3b start volume shrinkage, as shown in FIG. 1D. The shape variations of the cured layers 2b and 3b occur in the direction parallel to the substrate 1, and in the film thickness direction. In the volume shrinkage in the film thickness direction, the pattern edges of the cured layers 2b and 3b do not rise, and any positions uniquely shrink. As a baking furnace, generally, a circulating hot air oven in the air atmosphere and a furnace of a far infrared heater heating system in the air atmosphere, and under forcibly introduced air, can be used.

Figure 1E:
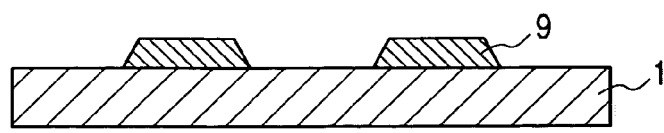

FIG. 1E is a view showing the state after the rise in temperature further advances from the state shown in FIG. 1D to reach the highest arrival temperature. In the case that the shrinkage ratio of the upper second precursor layer 3a is larger than that of the lower first precursor layer 2a, the upper layer and the lower layer are combined to each other so that a top of the combined structure is shrunk, as shown in FIG. 1E.

After that, the precursor pattern 6 is held for several minutes. When almost all regions of the precursor pattern 6 have been able to be melted, the fall in temperature is started. By returning the temperature to room temperature, the thick film member pattern 9, being a completely integrated desired pattern, can be obtained. The solid shape of the thus formed thick film member pattern 9 is the following one. That is, the planarity of the surface is secured, and particularly in the edge portion, the solid shape does not become an overhung shape (horn-shaped protuberant shape) from the ground (substrate interface) to the upper layer, and a trim forward tapered shape is formed on the whole surface.

EXAMPLE

Hereinafter, concrete examples are exemplified for describing the present invention in detail.

Example 1

An insulating material pattern, arranged between a thin film electrode pattern for an electron-emitting device, and wires located on the thin film electrode pattern, was manufactured by the manufacturing method of the present invention, which is a manufacturing method of an electron source substrate, on which electron-emitting members for an image-forming apparatus, are wired in a matrix.

As the substrate, soda-lime glass was used. On the substrate, first, a Pt material having a thickness of 50 nm was formed in a desired thin film pattern by using ordinary photolithographic etching as a lower electrode (thin film electrode pattern).

Next, a first photosensitive paste was formed as a film on the lower electrode (thin film electrode pattern) by the screen printing method. The plate of the screen printing is properly used according to the desired final film thickness. In this case, a wire rod of #145 (the number of rods per 25.4 mm), which was made of stainless steel and had a wire diameter of 55 μm, was used. Moreover, as the photosensitive paste, a paste composed of glass frit containing lead oxide as the principal component, an organic component having photosensitivity and a solvent component was used. The added mass ratio of the latter two components was within a range of from about 20% to about 30%. After that, drying at the temperature of about 100° C. for about fifteen minutes was performed with warm air and an infrared (IR) heater, in order to volatilize the solvent and to dry the paste. The film thickness of the first precursor layer after the drying was about 26 μm.

Next, as a second photosensitive paste, a paste composed of glass frit containing lead oxide, an organic component having photosensitivity and a solvent component was used. The added mass ratio of the latter two components was set to be within a range of from about 30% to 40% in order to have a shrinkage ratio larger than that of the first photosensitive paste. The second photosensitive paste was made to be a film by a method similar to that for the first photosensitive paste, and was dried. After the drying, the film thickness of the second precursor layer was about 25 μm, and the total film thickness of the first and the second precursor layers became about 51 μm.

Next, a mask having aperture portions corresponding to a desired insulating material pattern was aligned so that desired positions might be exposed, and a gap between the mask and the second precursor layer was adjusted to be about 100 μm. Then, the exposure of the first and the second photosensitive pastes was performed at the amount of exposure of 100 mJ/cm$^2$. To put it concretely, the mask was aligned so that the upper part of the lower electrode (thin film electrode pattern) might not be exposed in order to form contact holes (through-holes) in the upper part of the lower electrode (thin film electrode pattern), and the exposure of the first and the second photosensitive pastes was performed.

After the exposure, the first and the second precursor layers were developed using a weak alkaline solution capable of dissolving the unexposed portions of both of the first and the second precursor layers. After the development, the development was stopped by rinsing with pure water. Then, hydro-extracting and drying the precursor layers were performed with an air knife to obtain a precursor pattern in which the upper and the lower cured layers are integrated.

After that, the one-shot baking of the integrated upper and the integrated lower precursor patterns was started in a furnace of the IR heater heating system, in which the air was further forcibly introduced in the air atmosphere, while the precursor patterns were stepwise heated and cooled. In the process of the rises of the temperatures, the solvent component and the organic component remaining in the two photosensitive pastes first burned to disappear by about 400° C. After that, the temperatures of the precursor patterns were further raised, and the glass frit softened from about a temperature lower than the average softening point (480° C. in this case) of the glass frit of the upper and the lower cured layers by several tens of degrees. Then, the upper and the lower cured layers combined with each other, and the volume shrinkage of the cured layers was started. Then, the cured layers flowed while melting.

The rises of the temperatures furthermore progressed, and the temperatures rose to the softening point (the maximum arrival temperature was also set at this temperature in this case). Then, the temperatures were held for about ten minutes. At the point of time when almost all areas of the cured layers would melt, the fall in temperatures was started, and the temperatures of the cured layers returned to almost room temperature. Thus, the desired insulating material pattern was obtained.

Although the obtained insulating material pattern had a film thickness of about 26 μm and shrank by about 50% in the thickness direction thereof, the planarity of the surface of the solid shape thereof was assured, and the solid form was formed in a good forward tapered shape without taking an overhung shape from the ground (substrate interface) to the upper layer, especially in the edge portion.

After that, a pattern was formed as the upper electrode (wires) with an Ag paste on the insulating material pattern to have a thickness of about 8 μm by screen printing and baking, so that the upper electrode might be connected with the lower electrode (thin film pattern electrode) through through-holes.

The rate of occurrence of bad connections between the lower electrode and the upper electrode at the through-holes of the insulating material pattern on the electron source substrate manufactured as above was 0.1 ppm or less, and good matrix wires having no bad connections were obtained.

Example 2

An interlayer insulating layer pattern between column direction wires and row direction wires on an electron source substrate for an image-forming apparatus was manufactured by the manufacturing method of the present invention. FIG. 2 shows a schematic view of the image-forming apparatus. Reference numeral 11 denotes a rear plate being an electron source substrate. Reference numerals 12 and 13 denote a pair of device electrodes (the above-mentioned thin film electrode pattern) of an electron-emitting device. Reference numeral 14 denotes a supporting frame. Reference numeral 15 denotes a row direction wire. Reference numeral 16 denotes a column direction wire. Reference numeral 17 denotes an electroconductive film of an electron-emitting device. Reference numeral 18 denotes an electron-emitting device composed of a pair of device electrodes 12 and 13, and the electroconductive film 17. Reference numeral 20 denotes phosphor. Reference numeral 21 denotes an anode electrode. Reference numeral 22 denotes a face plate, including the phosphor 20 and the anode electrode 21.

An electron source is composed of the row direction wires 15, the column direction wires 16 and the electron-emitting devices 18. Incidentally, reference marks Dx and Dy denote fetch terminals of the row direction wires and the column direction wires, respectively. A reference mark HV denotes a fetch terminal of the anode electrode 21. Moreover, FIGS. 3A, 3B, 3C, 3D, 3E and 3F are views illustrating the manufacturing processes of the electron source. They are partially enlarged views of the rear plate 11.

Figure 3A:
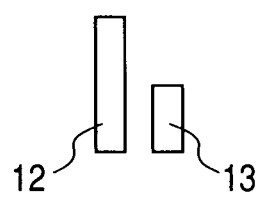
Figure 3B:
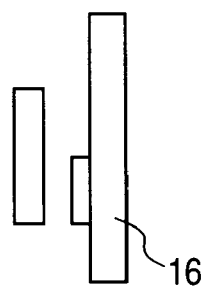

Low strain point glass PD200 (made by Asahi Glass Co., Ltd.) was used as the rear plate (hereinafter, sometimes simply referred to as a substrate) 11. First, a pair of device electrodes 12 and 13 was formed on the substrate (FIG. 3A). Next, as a column direction wire 16, silver paste (containing glass frit) having imparted photosensitivity was formed as a pattern in a stripe to be about 5 μm in thickness and 35 μm in width through the processes of being coated on the whole surface by screen printing, being heated to be dried, being exposed, being developed and being baked (FIG. 3B).

A dielectric layer, composed of a layered product of a first photosensitive paste and the second photosensitive paste, was formed on the substrate mentioned above. As each of the first and the second photosensitive pastes, a paste composed of glass frit containing lead oxide as the principal component, an added organic component having photosensitivity and an added solvent component was used. Incidentally, the added mass ratio of the organic component having the photosensitivity and the solvent component in the first photosensitive paste was set to be within a range of from about 20% to about 30%. Moreover, the added mass ratio of the organic component having the photosensitivity and the solvent component in the second photosensitive paste was set to be within a range of from about 30% to about 40% in order to have a shrinkage ratio larger than that of the first photosensitive paste.

Figure 3C:
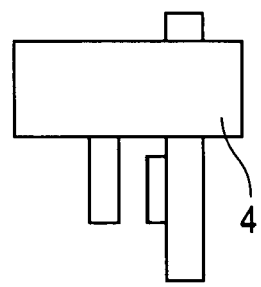

The first photosensitive paste was formed into a film by screen printing using a plate of a wire rod of #200 (the number of rods per 25.4 mm), which was made of stainless steel and had a wire diameter of 40 µm. Moreover, the second photosensitive paste was formed into a film by screen printing using a plate of a wire rod of #145 (the number of rods per 25.4 mm), which was made of stainless steel and had a wire diameter of 55 µm. Then, drying at the temperature of about 100° C. for about fifteen minutes was performed in order to volatilize the solvent and to dry the paste, and thereby, a layered product 4 of the dielectric layer (precursor layer) was formed (FIG. 3C). The film thickness of the first precursor layer after the drying was about 19 µm, and the film thickness of the second precursor layer after the drying was about 25 µm. The total film thickness of the layered product 4 became about 44 µm.

Figure 3D:
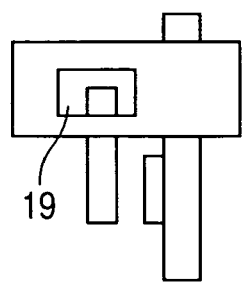

Next, as with Example 1, after performing exposure and development in a lump, severally, a precursor pattern composed of integrated upper and lower precursor layers was baked in a lump (held for ten minutes at the maximum arrival temperature of 520° C. after a rise of temperature), and an interlayer insulation layer pattern partially including a contract hole (through-hole) 19 for connecting the device electrode 12 with a row direction wire 15 to be formed later was obtained (FIG. 3D). Consequently, although the total film thickness of the precursor pattern also shrank to be about 22 µm, which was a shrinkage of about 50% in the thickness direction, the planarity of the surface of the solid shape of the precursor pattern was assured as in Example 1, and a good forward tapered shape was also formed in the edge portion, without forming an overhung shape from the ground (substrate interface) to the upper layer.

Figure 3E:
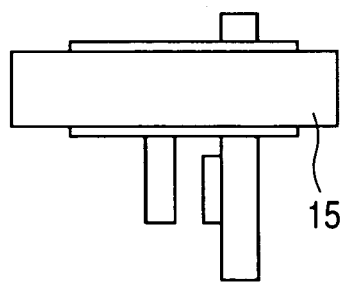
Figure 3F:
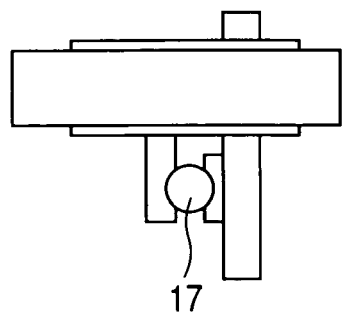

After that, an Ag paste was formed to have a pattern of a stripe as the row direction wires 15 by screen printing and baking on the obtained interlayer insulation layer pattern (FIG. 3E). After that, an electroconductive film 17 was coated to form an electron-emitting device (FIG. 3F).

In particular, in this example, because the shrinkage ratio of the second dielectric layer was larger than the shrinkage ratio of the first dielectric layer, the shape of the dielectric pattern became better, and the connection between the device electrode 12 and the row direction wire 15 was performed more certainly.

The interlayer insulation layer pattern manufactured by the above method was used for an electron source substrate for an image-forming apparatus, and the image-forming apparatus was produced. The gap of an opposed substrate (face plate) and the electron source substrate was set to be about 1.5 mm and a voltage applied to the anode electrode was set to be 12 kV. Then, when the image-forming apparatus was operated, no generation of unusual electrical discharges between the electron source and the anode electrode could be confirmed, and a good image display could be obtained.

Example 3

A thick film conductive material pattern was formed on a substrate by the manufacturing method of the present invention.

As a first photosensitive paste, a paste produced by further mixing an organic component having photosensitivity and a solvent component to a mixture of Ag particles as a conductive material and glass frit. Incidentally, the mass ratio of the organic component having the photosensitivity and the solvent component in the first photosensitive paste was set to be within a range of from about 20% to about 40%. As the second photosensitive paste, a paste having the same components as those of the first photosensitive paste and having a shrinkage ratio adjusted to be larger than that of the first photosensitive paste was used. To put it concretely, the mass ratio of the organic component having the photosensitivity and the solvent component in the second photosensitive paste was set to be within a range of from about 30% to about 40%.

A screen printing method using a plate of a wire rod #400 (the number of rods per 25.4 mm), which was made of stainless steel and had a wire diameter of 23 µm, was used for the film formation of the first and the second photosensitive pastes. After the film formation, drying at a temperature of about 120° C. for about fifteen minutes was performed in order to volatilize the solvent and to dry the first and the second photosensitive pastes. The film thicknesses after the drying were each about 8 µm, and the film thickness of the layered product was about 16 µm.

Next, as in Example 1, after performing exposure and development in a lump severally, a precursor pattern composed of integrated upper and lower precursor layers was baked in a lump (to be held for ten minutes at the maximum arrival temperature of 480° C. after a rise of temperature), and thus, a thick film conductive material pattern was obtained. Although the total film thickness of the precursor pattern after the backing was about 9.6 µm, which was a shrinkage of about 40 µm in the thickness direction, a good forward tapered shape of the solid shape of the precursor pattern was formed also in the edge portion without forming an overhung shape from the ground (substrate interface) to the upper layer, as in Example 1.

Incidentally, when the thick film conductive material was applied to the column direction wires of the image-forming apparatus of Example 2 mentioned above, a good image-forming apparatus was obtained, as in Example 2.

In the present invention, because a precursor pattern is formed by performing one-shot exposure of a layered product without performing a plurality of times of exposure processes of each layer of the product using different aperture shapes, there is no pattern accuracy decrease by the plurality of times of exposure, and it becomes possible to form a desired pattern shape with sufficient accuracy. Because the above-mentioned layered product, especially, consists of photosensitive pastes with different shrinkage ratios, by using a photosensitive paste with a large shrinkage ratio as the upper layer of the layered product, the upper layer shrinks more at the time of baking. Consequently, the cross section of the pattern becomes a trapezoidal shape, and a good forward tapered shape and a surface flatness performed are assured in a pattern edge portion.

Consequently, according to the present invention, it is possible to provide a thick film member pattern efficiently with a high precision by a small number of processes.

What is claimed is:

1. A method of manufacturing an image forming apparatus having a plurality of electron-emitting members, a plurality of row direction wires and a plurality of column direction wires, which wire the plurality of electron-emitting members in a matrix, and a dielectric layer arranged between the row direction wires and the column direction wires, said method comprising the steps of:

forming a resist precursor layer by imparting a first photosensitive paste, and by drying the first photosensitive paste;

forming a second precursor layer by imparting a second photosensitive paste onto the first precursor layer, and by drying the second photosensitive paste;

forming a precursor pattern by exposing a layered product of the first precursor layer and the second precursor layer through a mask of a predetermined pattern, and by developing the exposed layered product; and forming the dielectric layer by baking the precursor pattern, wherein a shrinkage ratio of the second precursor layer after the baking to the second precursor layer before the baking is larger than a shrinkage ratio of the first precursor layer after the baking to the first precursor layer before the baking.

2. A method of manufacturing an image-forming apparatus according to claim 1, further comprising the steps of:

forming a first precursor layer by imparting a first photosensitive paste comprising a glass frit, an organic component and a solvent component onto a substrate, and by drying the first photosensitive paste;

forming a second precursor layer by imparting a second photosensitive paste comprising a glass frit, an organic component and a solvent component onto the first precursor layer, and by drying the second photosensitive paste;

forming a precursor pattern by exposing a layered product of the first precursor layer and the second precursor layer through a mask of a predetermined pattern, and by developing the exposed layered product; and forming the dielectric layer by baking the precursor pattern, wherein a mass ratio of the organic component and the solvent component of the first photosensitive paste to the first photosensitive paste is less than a mass ratio of the organic component and the solvent component of the second photosensitive paste to the second photosensitive paste.

3. A method of manufacturing an image-forming apparatus according to claim 1, wherein the column direction wires are arranged under the dielectric layer, and further comprising the steps of:

forming a first precursor layer by imparting a first photosensitive paste, and by drying the first photosensitive paste;

forming a second precursor layer by imparting a second photosensitive paste on to the first precursor layer, and by drying the second photosensitive paste;

forming a precursor pattern by exposing a layered product of the first precursor layer and the second precursor layer through a mask of a predetermined pattern, and by developing the exposed layered product; and forming the column direction wires by baking the precursor pattern, wherein a shrinkage ratio of the second precursor layer after the baking to the second precursor layer before the baking is larger than a shrinkage ratio of the first precursor layer after the baking to the first precursor layer before the baking.

* * * * *